(12) United States Patent
Chen et al.

(10) Patent No.: US 7,898,038 B2
(45) Date of Patent: Mar. 1, 2011

(54) METHOD TO IMPROVE WRITER LEAKAGE IN SIGE BIPOLAR DEVICE

(75) Inventors: Alan S. Chen, Windermere, FL (US); Mark Dyson, Singapore (SG); Nace M. Rossi, Singapore (SG); Ranbir Singh, Singapore (SG)

(73) Assignee: Agere Systems, Inc., Allentown, PA (US)

( * ) Notice: Subject to any disclaimer, the term of this patent is extended or adjusted under 35 U.S.C. 154(b) by 106 days.

(21) Appl. No.: 12/476,994

(22) Filed: Jun. 2, 2009

(65) Prior Publication Data

US 2009/0236668 A1 Sep. 24, 2009

Related U.S. Application Data

(62) Division of application No. 11/673,645, filed on Feb. 12, 2007, now Pat. No. 7,557,010.

(51) Int. Cl.
*H01L 21/00* (2006.01)

(52) U.S. Cl. .......... 257/370; 257/536; 257/565; 257/632; 257/E21.009; 257/E21.043; 257/E21.214; 257/E21.222; 257/E21.461; 257/E21.633; 257/E27.015

(58) Field of Classification Search ........ 257/370, 257/526, 565, 632, E21.009, 43, 214–229, 257/461, 633, 696, 27.015, 29.085, 267
See application file for complete search history.

(56) References Cited

U.S. PATENT DOCUMENTS

| | | | |
|---|---|---|---|
| 4,879,255 A | 11/1989 | Deguchi et al. | |
| 5,241,214 A | 8/1993 | Herbots et al. | |
| 5,266,504 A | 11/1993 | Blouse et al. | |
| 5,599,723 A | 2/1997 | Sato | |
| 5,846,867 A | 12/1998 | Gomi et al. | |
| 6,492,711 B1 | 12/2002 | Takagi et al. | |
| 6,756,604 B2 | 6/2004 | Kovacic et al. | |
| 7,071,500 B2 | 7/2006 | Miura et al. | |
| 7,214,973 B2 | 5/2007 | Miura et al. | |
| 7,235,492 B2 * | 6/2007 | Samoilov | 438/714 |
| 7,312,128 B2 * | 12/2007 | Kim et al. | 438/300 |
| 7,466,008 B2 * | 12/2008 | Ko et al. | 257/526 |
| 7,560,352 B2 * | 7/2009 | Carlson et al. | 438/300 |
| 2003/0201461 A1 | 10/2003 | Sato et al. | |
| 2006/0043529 A1 | 3/2006 | Chidambarrao et al. | |
| 2008/0191246 A1 | 8/2008 | Chen et al. | |

* cited by examiner

*Primary Examiner*—Michael S Lebentritt (57) ABSTRACT

The invention, in one aspect, provides a method for fabricating a semiconductor device, which includes conducting an etch through an opening in an emitter layer to form a cavity from an underlying oxide layer that exposes a doped tub. A first silicon/germanium (SiGe) layer, which has a Ge concentration therein, is formed within the cavity and over the doped tub by adjusting a process parameter to induce a strain in the first SiGe layer. A second SiGe layer is formed over the first SiGe layer, and a capping layer is formed over the second SiGe layer.

10 Claims, 10 Drawing Sheets

METHOD TO IMPROVE WRITER LEAKAGE IN SIGE BIPOLAR DEVICE

CROSS-REFERENCE TO RELATED APPLICATIONS

This Application is a Divisional of U.S. application Ser. No. 11/673,645 filed on Feb. 12, 2007, now U.S. Pat. No. 7,557,010 to Alan S. Chen, et al., entitled "METHOD TO IMPROVE WRITER LEAKAGE IN A SiGe BIPOLAR DEVICE," currently allowed; commonly assigned with the present invention and incorporated herein by reference.

TECHNICAL FIELD

The invention is directed, in general, to a method of manufacturing a semiconductor device and, more specifically, to a bipolar device and method to reduce writer leakage within the bipolar device.

BACKGROUND

Optimization of semiconductor devices continues to be an important goal for the semiconductor industry. The continued miniaturization of semiconductor devices, such as bipolar transistors, presents ongoing challenges to semiconductor manufacturers in maintaining or improving that optimization while maintaining product yields and minimizing production time and costs. One such challenge resides in reducing the writer leakage associated with bipolar transistors, such as NPN bipolar transistors.

As performance requirements have continued to increase, writer leakage concerns have become more important to semiconductor manufacturers and attention has begun to be focused on how to decrease writer leakage. For example, in a specific device, writer leakage can occur when a circuit cannot maintain a specific voltage (~300 mV) across the write head when a current of 50 uA is injected through the head. When this occurs, the write head open circuit does not function properly, and operating voltages cannot be maintained at required levels for optimum device performance when writer leakage occurs. As a result, device yield and performance is decreased, and as device sizes continue to shrink and performance requirements continues to increase, writer leakage will have even a greater impact.

Accordingly, there is a need to provide a process and device by which writer leakage is reduced in a bipolar transistor device.

SUMMARY

To address the above-discussed deficiencies, in one embodiment, there is provided a method of manufacturing a semiconductor device. This embodiment includes conducting an etch through an opening in an emitter layer to form a cavity from an underlying oxide layer that exposes a doped tub. A first silicon/germanium (SiGe) layer, which has a Ge concentration therein, is formed within the cavity and over the doped tub by adjusting a process parameter to induce a strain in the first SiGe layer. A second SiGe layer is formed over the first SiGe layer, and a capping layer is formed over the second SiGe layer.

In another embodiment, a semiconductor device is provided that includes a first silicon/germanium SiGe layer located over a collector tub and that has a Ge concentration and wherein a thickness of the first SiGe layer is less than 35 nm and has a strain associated therewith. A second SiGe layer is located the first SiGe layer. A silicon capping layer is located over the second SiGe layer and an emitter layer is located over the silicon capping layer. This embodiment further includes a non-bipolar transistor region that includes transistors having gate electrodes and source/drains associated therewith.

In another embodiment, a semiconductor device is provided that includes a bipolar transistor region. In this embodiment, the bipolar transistor region includes a first silicon/germanium SiGe layer located over a collector tub that has a Ge concentration that ranges from about 5% to about 10% by weight and has a strain associated therewith. A second SiGe layer is located over the first SiGe layer. A silicon capping layer is located over the second SiGe layer, and an emitter layer is located over the silicon capping layer. This embodiment further includes a non-bipolar transistor region, including transistors having gate electrodes and source/drains associated therewith.

Another embodiment provides a method of manufacturing a semiconductor device. This embodiment includes forming an emitter for bipolar transistors in a bipolar transistor region. The formation of the emitter includes conducting an etch through an opening in an emitter layer to form a cavity from an underlying oxide layer and expose a collector tub. A first silicon/germanium (SiGe) layer is formed within the cavity and over the collector tub by adjusting a process parameter to induce a strain in the first SiGe layer, which has a Ge concentration therein. A second SiGe layer is formed over the first SiGe layer. A capping layer is formed over the second SiGe layer and an emitter layer is formed over the capping layer. This embodiment further includes forming non-bipolar transistors in a non-bipolar region, including forming gate electrodes over non-bipolar transistor wells and forming source/drains in the wells.

The foregoing has outlined certain embodiments so that those skilled in the art may better understand the detailed description that follows. Additional embodiments and features are described hereinafter that form the subject of the claims. Those skilled in the art should appreciate that they can readily use the disclosed conception and specific embodiment as a basis for designing or modifying other structures for carrying out the same purposes as set forth herein.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
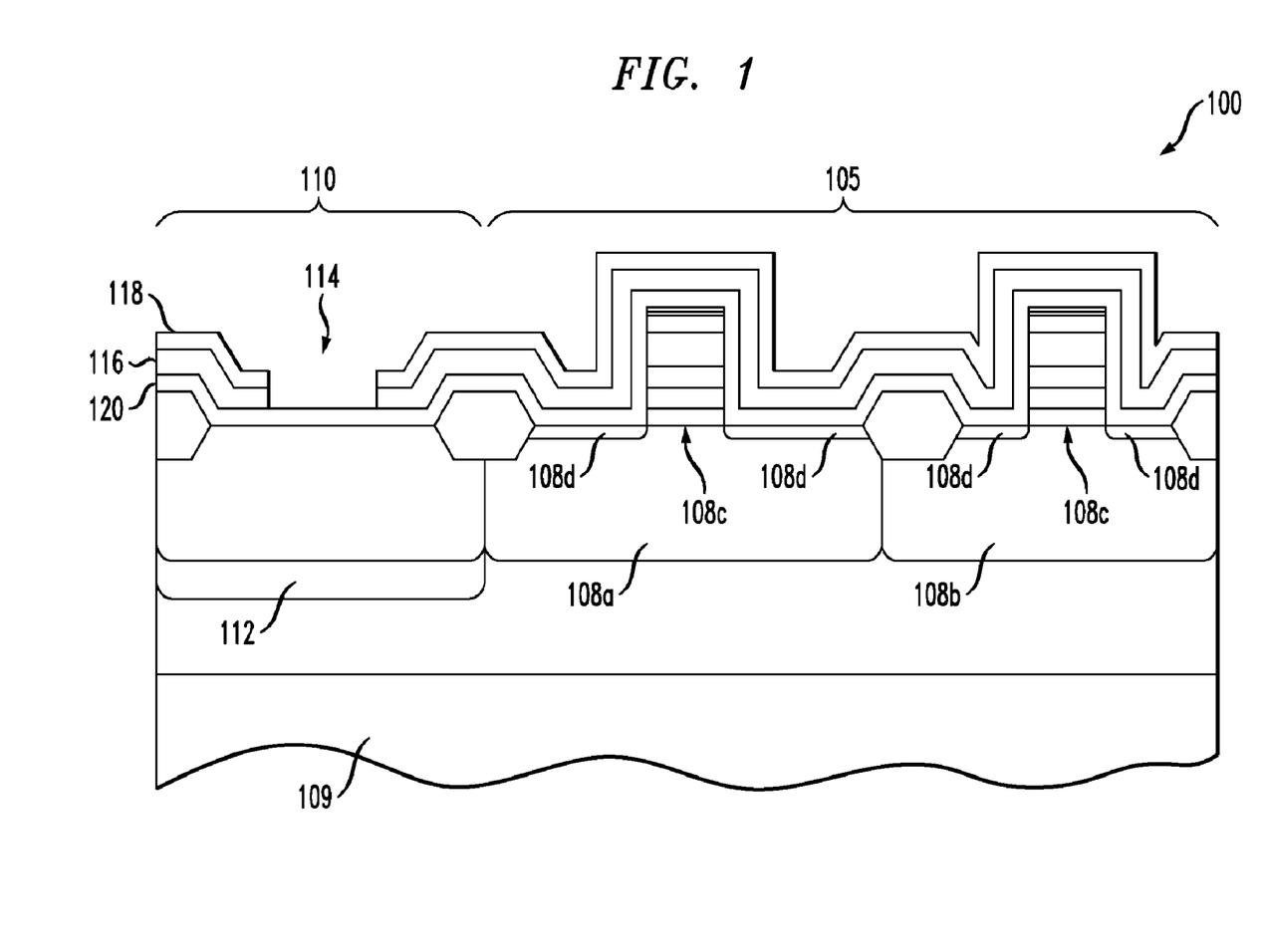
FIGS. 1-3 illustrates a semiconductor device as provided by one embodiment of the invention at various stages of manufacture.

Referring initially to FIG. 1, there is illustrated an embodiment of a semiconductor device 100 of the invention at an early stage of manufacture. In this embodiment, the semiconductor device 100 includes a transistor region 105 comprising non-bipolar transistors 108 (e.g., PMOS or NMOS transistors that are not configured as bipolar devices) that are formed over a semiconductor substrate 109. The non-bipolar transistors 108 may be of conventional design, and they may be manufactured with conventional processes and materials known to those skilled in the art. In the illustrated embodiment, the transistors 108 are configured as CMOS devices. However, the transistors 108 may also be configured as all NMOS or PMOS devices. Moreover, it should be understood that though certain dopant schemes are shown and discussed herein, those skilled in the art will understand that they may be reversed or other dopant schemes may be used. In the illustrated embodiment, the transistors 108 are configured as CMOS devices and include a PMOS tub 108a and an NMOS tub 108b and other conventional features, such as a gate electrode 108c and source/drains 108d.

The semiconductor device 100 further includes a bipolar transistor region 110. At this stage of manufacture, a collector tub 112 has been formed in the semiconductor substrate 109, and an emitter window 114 has been formed in a polysilicon layer 116 and a nitride layer 118 that are located over both the non-bipolar transistor region 105 and the bipolar transistor region 110. Conventional processes, such as an etch process, may be used to form the emitter window 114. An oxide layer, which is not shown, may also be formed over the nitride layer 118. The emitter window 114 has been formed to expose an underlying oxide layer 120. Conventional processes and materials may be used to form the features seen in FIG. 1.

Figure 2:
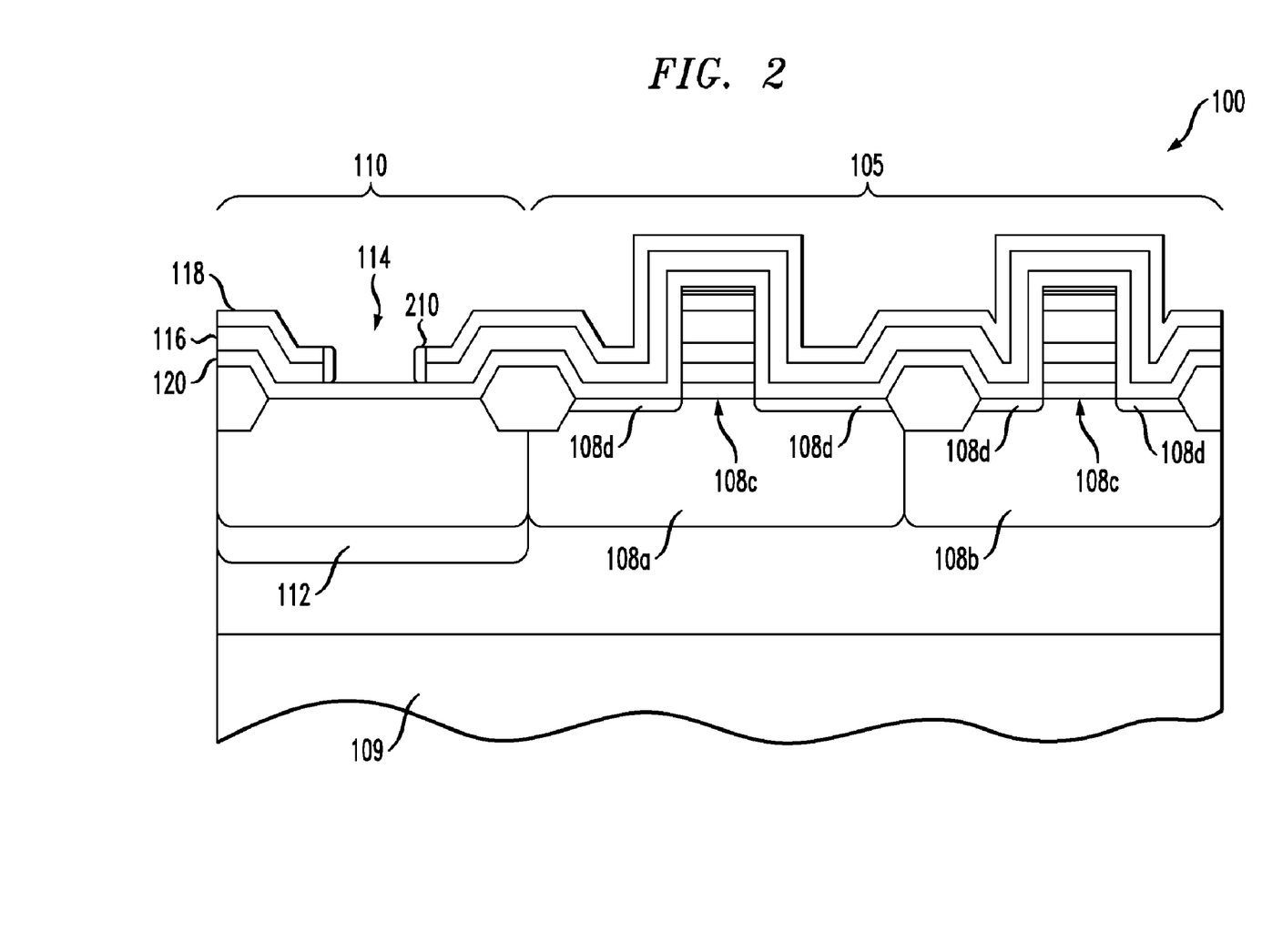

FIG. 2 shows the semiconductor device 100 after the formation of emitter spacers 210 on opposing sides of the emitter window 114. The emitter spacers 210 may also be fabricated using conventional processes and materials. In one embodiment, the emitter spacers 210 have an oxide/nitride/oxide stack configuration. However, in other embodiments, the emitter spacers 210 may simply have a single or double layer configuration.

Figure 3:
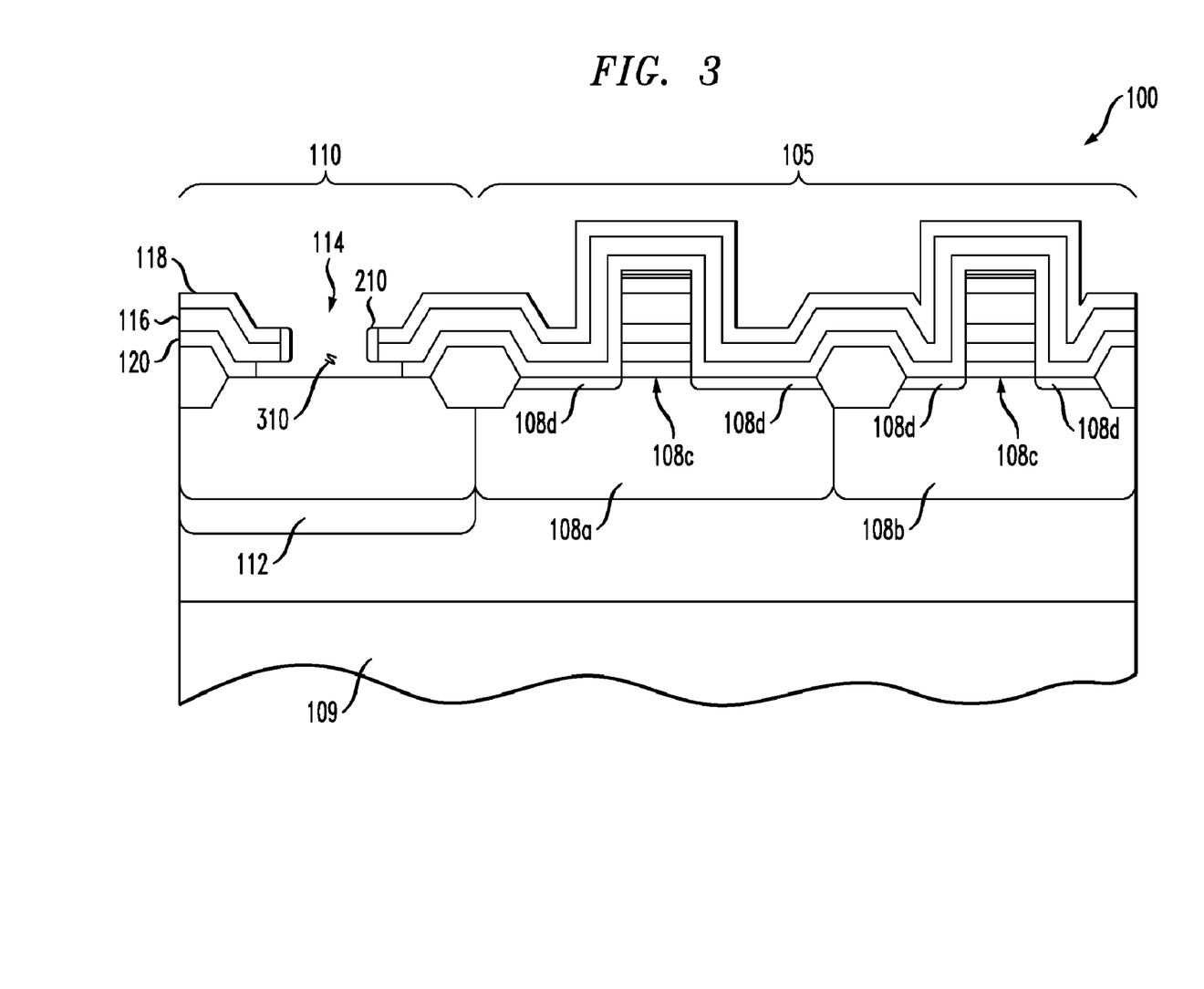

Following the formation of the emitter spacers 210, an etch, such as an isotropic etch is conducted on the exposed oxide layer 120 to form a cavity 310 from the oxide layer 120, as seen in FIG. 3. The etch exposes the underlying collector tub 112. The cavity 310 has lateral portions that extend under the polysilicon layer 116 and the nitride layer 118. The etch used to form the cavity 310 may be a conventional etch known to those skilled in the art.

Figure 4:
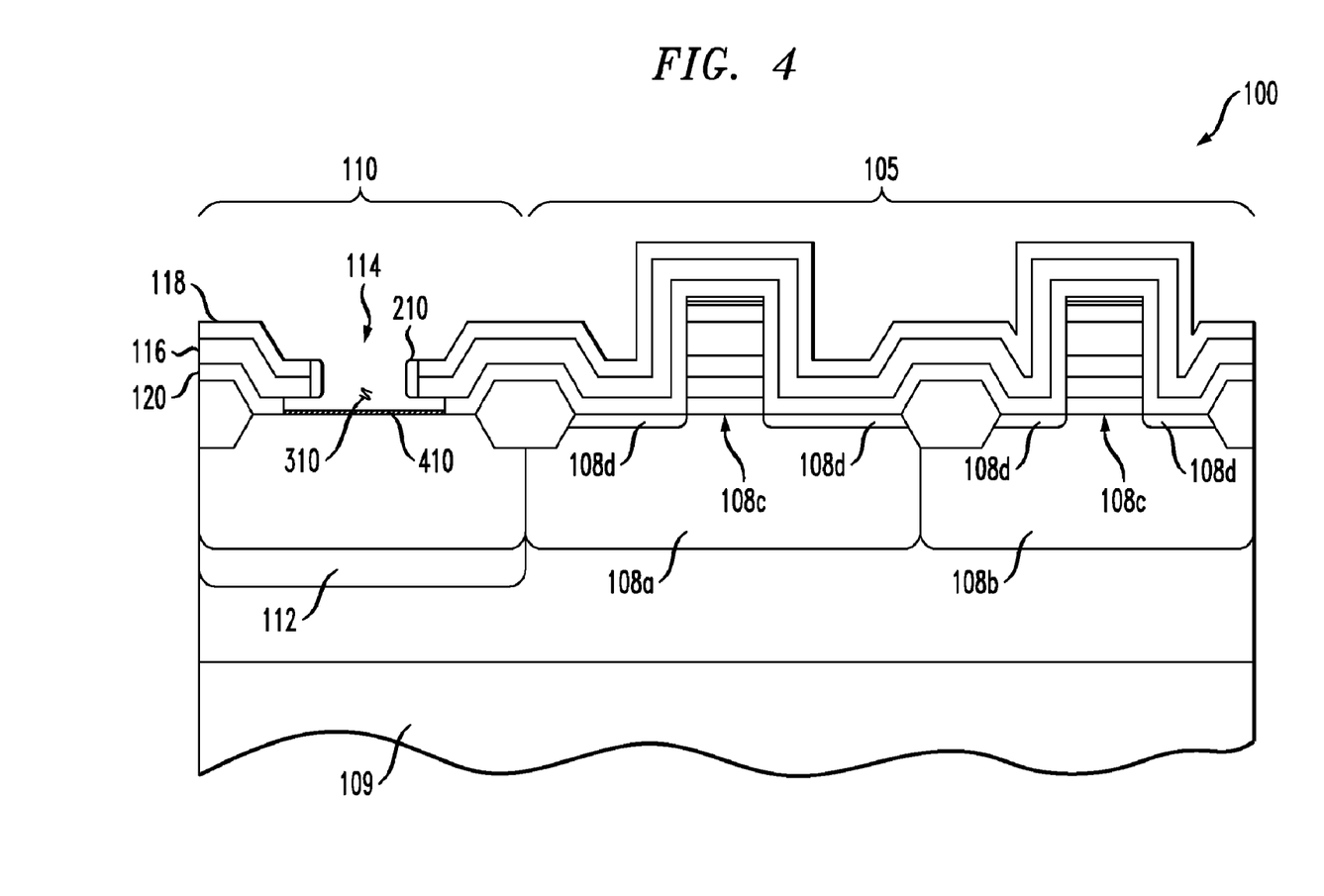
FIG. 4 illustrates the formation of a SiGe layer wherein a process parameter is adjusted to incorporate stress therein.

In FIG. 4, a silicon/germanium (SiGe) layer 410 has been formed within the cavity 310 and over the tub 112. In one embodiment, the SiGe layer 410 may be formed directly on the tub 112. The SiGe layer 410 is the first layer of at least a two or three layer stack that forms a base portion of an emitter of a bipolar transistor. As discussed in more detail below, a graded layer is deposited over the SiGe layer 410, and a cap layer is deposited over the graded layer. In conventional processes, the SiGe 410 layer is considered to be a buffer layer only and is formed in a way such that no to very little stress is incorporated into the film. In other words, no steps are taken to incorporate additional stress into the film. However, it has been unexpectedly found in the invention that incorporation of a larger amount of stress, either compressive or tensile, into SiGe layer 410 reduces writer leakage, and thereby, improves device yield and performance. The strain level is controlled through one or more selected fabrication processes so that a high enough stress level is obtained such that the formation of point defects is stopped or significantly reduced in the subsequently deposited graded layer. However, the selectivity of the SiGe layer 410 should remain unchanged such that it will not grow on the spacers 210, but only within the cavity 310. Without the added stress, it is believed that these point defects would continue to grow in the graded layer, which in turn, would increase writer leakage. However, when a higher stress is incorporated into the SiGe layer 410, it is believed that this stress prevents point defects from growing within the graded layer.

In one embodiment of the invention, the stress is incorporated by adjusting a process parameter during the fabrication of the SiGe layer 410. For example, the process may be adjusted to control the thickness of the SiGe layer 410 such that the thickness of the SiGe layer 410 is less than 35 nm. In one aspect of this embodiment, the thickness of the SiGe layer 410 may range from about 26 nm to about 34 nm, and the Ge concentration in the SiGe layer may be about 12% by weight. In this particular embodiment, the SiGe layer 410 may be formed to the prescribed thickness range by flowing a gas mixture of dichlorosilane (DCS) at a flow rate of about 100 sccm, $GeH_4$ at a flow rate of about 90 sccm, and HCl at a flow rate of about 40 sccm for about 60 sec. and at a temperature of about 750° Celsius and at a pressure of about 5.8 Torr. These parameters are given for illustrative purposes only, and it should be understood by those who are skilled in the art that different process parameters may be used.

In another embodiment, the Ge concentration in the SiGe layer 410 or its thickness may be adjusted to incorporate stress into the SiGe layer 410. For example, the flow rate of Ge may be adjusted such that a concentration of Ge in the SiGe layer 410 ranges from about 5% to about 10% by weight, and in another aspect of this embodiment, the thickness of the SiGe layer 410 may range from about 26 nm to about 43 nm. In this particular embodiment, the SiGe layer 410 may be formed by flowing a gas mixture of dichlorosilane (DCS) at a flow rate of about 100 sccm, $GeH_4$ at a flow rate ranging from about 40 sccm to about 80 sccm, and HCl at a flow rate of about 40 sccm for about 59 sec. and at a temperature of about 750° Celsius and at a pressure of about 5.8 Torr. These parameters are given for illustrative purposes only, and it should be understood by those who are skilled in the art that different process parameters may be used.

Figure 5:
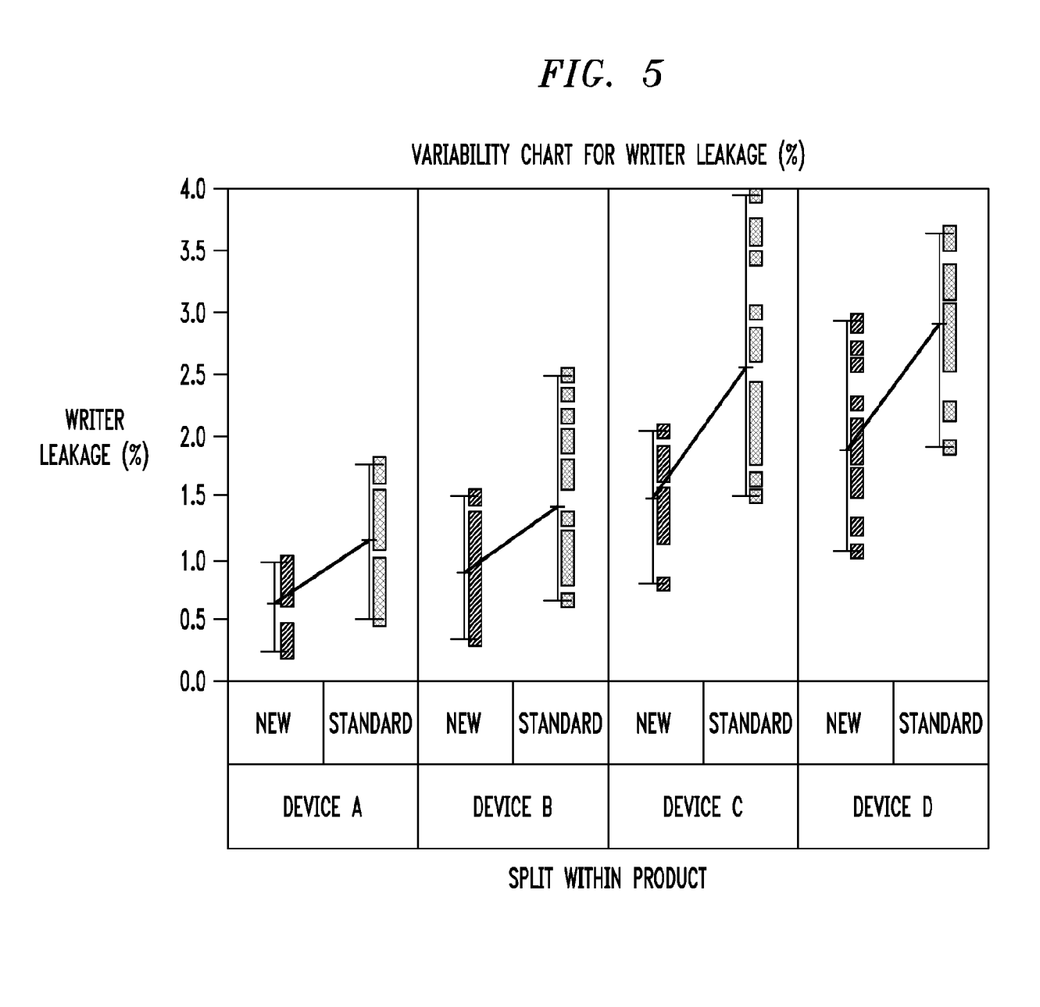
FIG. 5 is a graph that illustrates how the higher stress of the SiGe layer reduces writer leakage.

The improvement in writer leakage, as achieved by the invention, is shown in FIG. 5. FIG. 5 is a writer leakage plot for four different bipolar devices that compares write leakage associated with conventionally formed devices and devices formed using the processes as provided by the invention. As seen from FIG. 5, regardless of the type of design of the bipolar device, writer leakage is reduced when stress is added to the SiGe layer 410. This is an unexpected result, since a correlation between writer leakage and stress within SiGe layer 410 was not previously recognized. Thus, those skilled in the art were not motivated to add stress to the SiGe layer 410 as it was merely perceived as a buffer layer between the collector tub 112 and the overlying graded layer.

Figure 6:
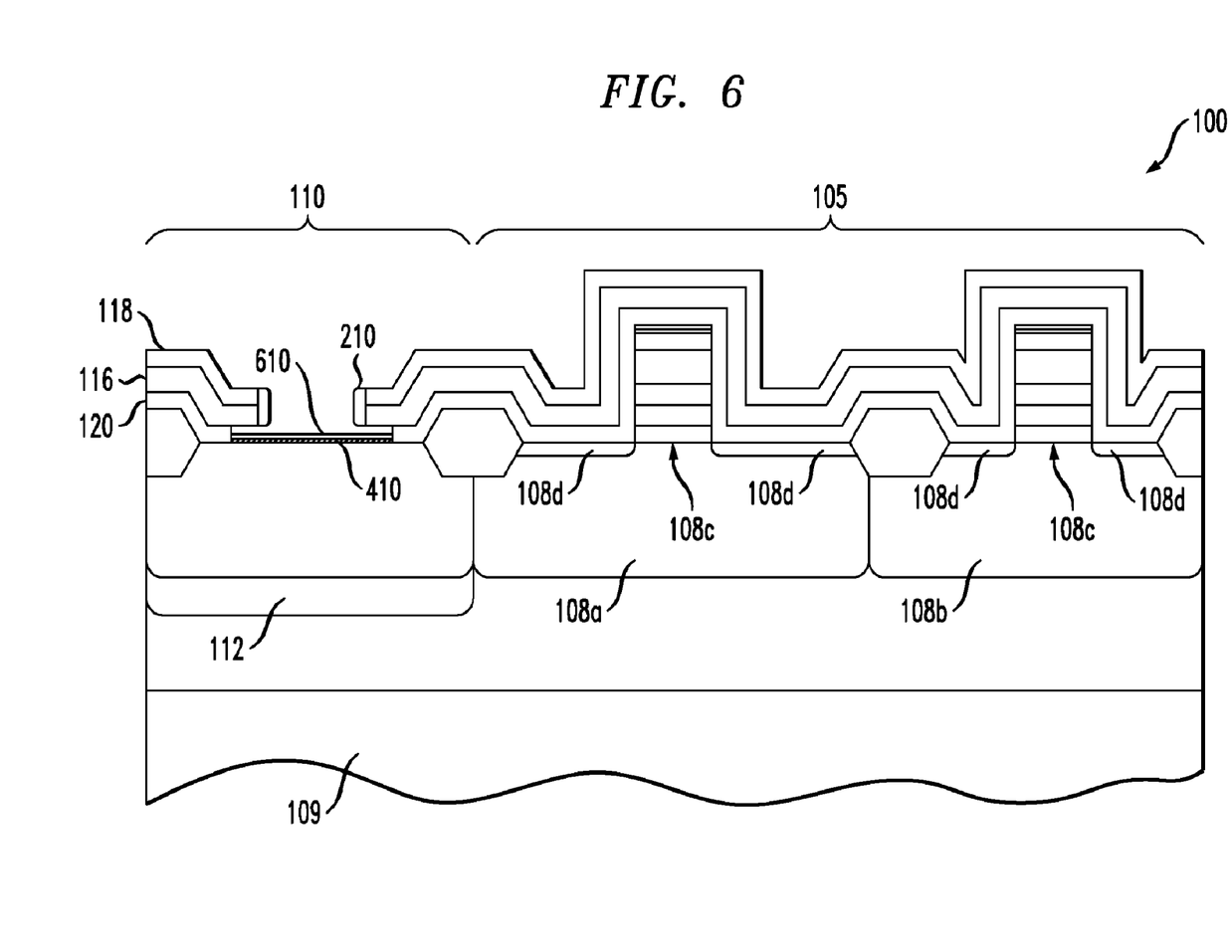
FIGS. 6-9 illustrate views of the semiconductor device following the formation of the SiGe layer.

In FIG. 6, a silicon/germanium (SiGe) graded layer 610 has been formed over the SiGe layer 410 and within the cavity 310 (FIG. 4). The SiGe graded layer 610 has a graded Ge concentration that ranges from about the concentration of the SiGe layer 410 at the interface of the SiGe layer 410 and the graded layer 610 to about zero Ge concentration at an upper surface of the graded layer 610. For example in one embodiment, where the Ge concentration in the SiGe layer 410 is about 12%, the Ge concentration in the graded layer 610 at the interface will also be about 12%. This Ge concentration then decreases as you move to the top of the graded layer 610 to a Ge concentration of about zero. It should be understood that because the Ge concentration is graded in this manner, the Ge concentration at the top of the graded layer 610 will not necessarily be exactly zero, but the Ge concentration may be very low, for example 1% or less. The thickness of the graded layer 610 may be approximately 30 nm thick.

Conventional processes may be used to form the graded layer 610. For example in one embodiment, the graded layer 610 may be formed by flowing a gas mixture of dichlorosilane (DCS) at a flow rate of about 100 sccm, $GeH_4$ at a ramping flow rate starting at about 90 sccm and ending at about 0 sccm, $B_2H_6$ at a flow rate ranging from about 40 sccm to about 50 sccm, HCl at a flow rate of about 40 sccm for about 85 sec. and at a temperature of about 750° Celsius and at a pressure of about 5.8 Torr.

Because the graded layer 610 is deposited over the SiGe layer 410, a higher stress component is incorporated therein and point defects are minimized and do not continue to grow in the same way as found in conventional processes. Since point defects are minimized, writer leakage is improved or reduced as illustrated in FIG. 5.

Figure 7:
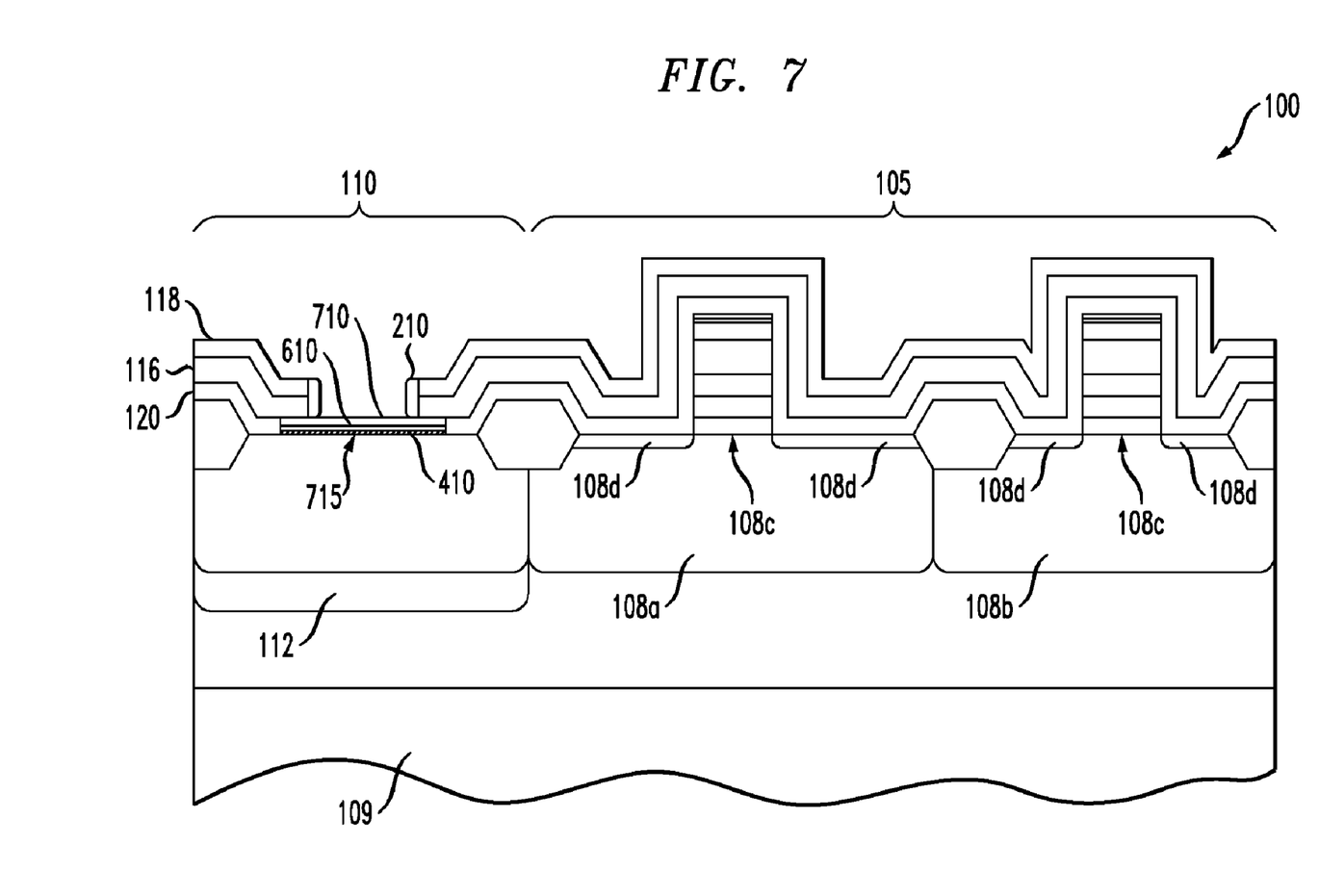

In FIG. 7, a cap layer 710 has been formed over the graded layer 610. In one embodiment, the cap layer 710 does not contain any significant amount of Ge therein, except for perhaps trace amounts that may inadvertently enter into the cap layer 710. The thickness of the graded layer 610 may be approximately 48 nm thick. Conventional processes may be used to form the cap layer 710. The cap layer 710 completes SiGe stack layer 715.

Figure 8:
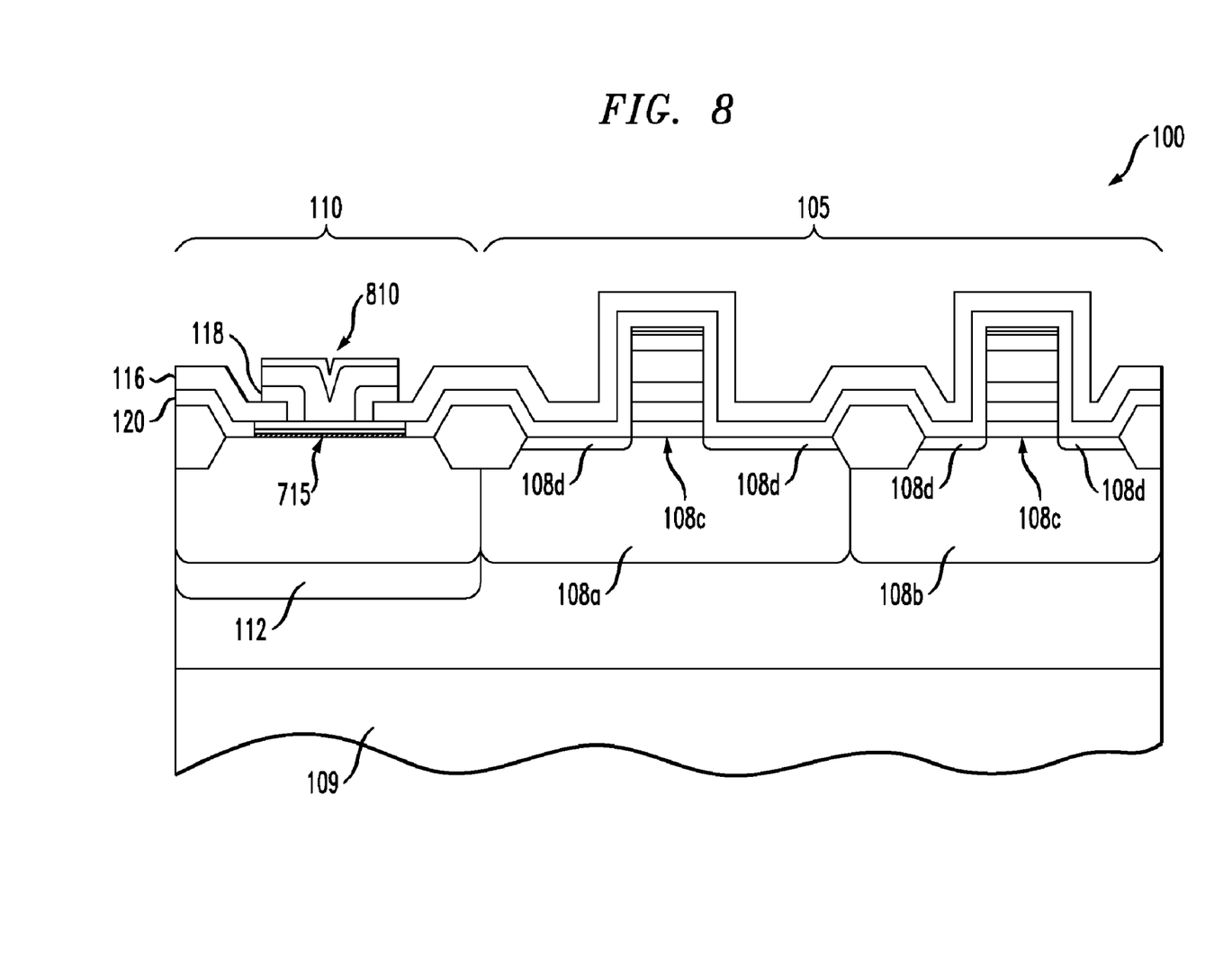

Following the formation of the SiGe stack layer 715, conventional processes may be used to form the emitter 810 as seen in FIG. 8. An emitter layer, such as a poly layer, and an oxide layer (not shown) may be deposited over the cap layer 710. A conventional base poly mask and etch and oxide spacer etch may then be conducted to arrive and the semiconductor device 100 shown in FIG. 9.

Figure 9:
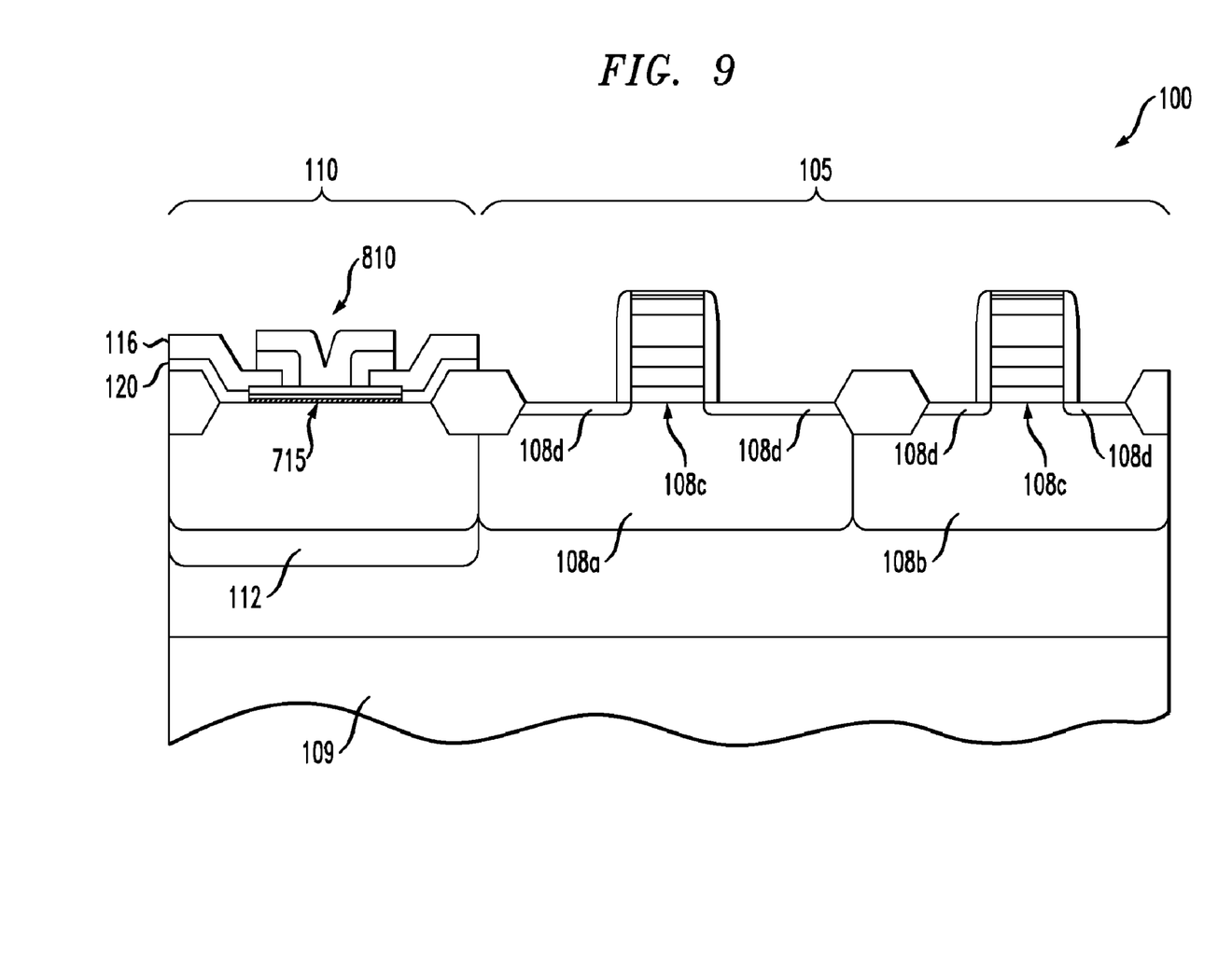
Figure 10:
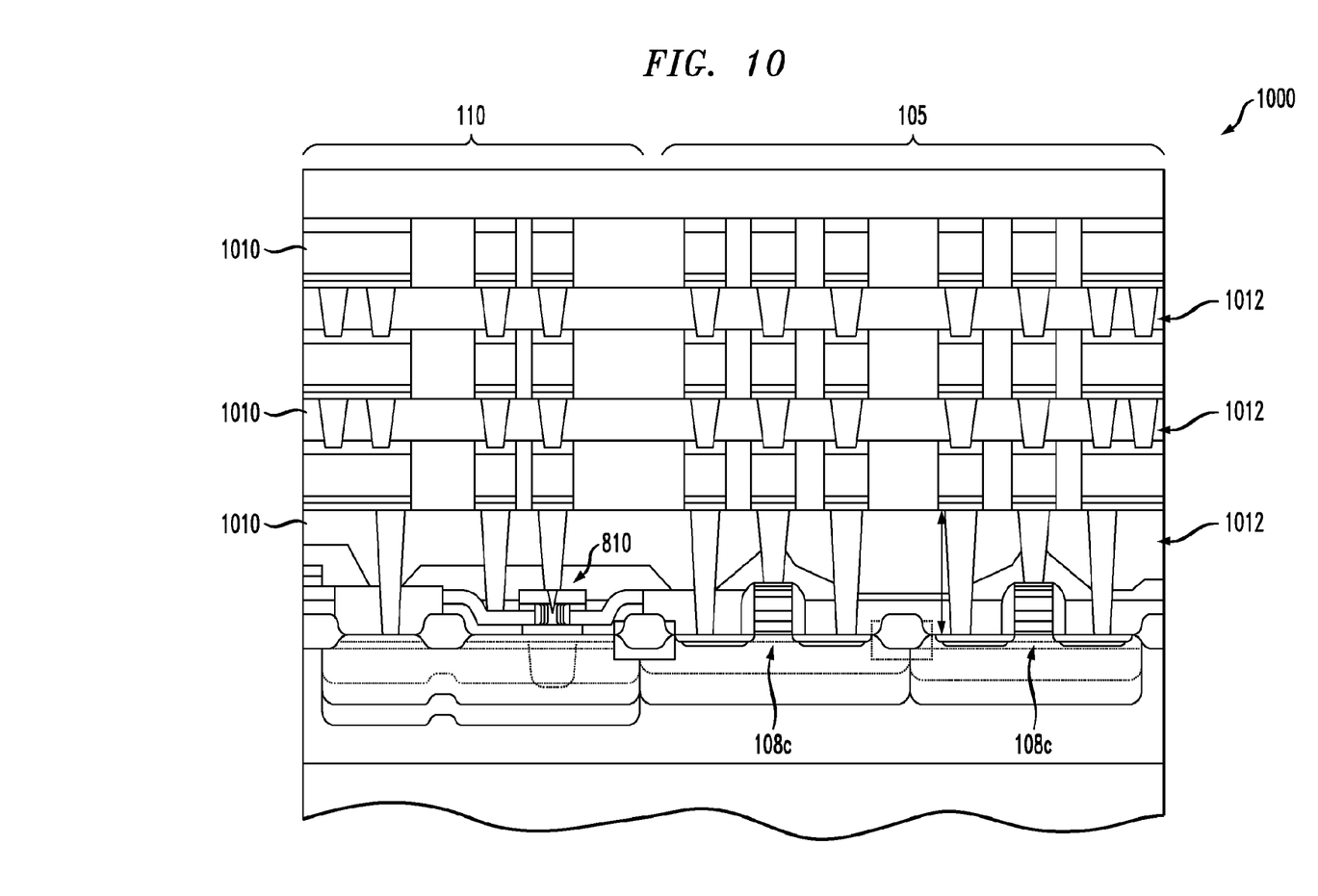
FIG. 10 illustrates a view of the bipolar device and MOS transistors configured as an integrated circuit.

After the structure of FIG. 9 is achieved, conventional fabrication processes can be used to complete an integrated circuit device 1000, as seen in FIG. 10, which includes dielectric layers 1010 and interconnects 1012 formed in and over the dielectric layers 1010 that are located over the emitter 810 and the non-bipolar transistors 108c Although the present invention has been described in detail, those skilled in the art should understand that they can make various changes, substitutions and alterations herein without departing from the spirit and scope of the invention in its broadest form.

What is claimed is:

1. A semiconductor device, comprising:
   a bipolar transistor region, including:
      a first a silicon/germanium SiGe layer located over a collector tub and having a Ge concentration and wherein a thickness of the first SiGe layer is less than 35 nm and has a strain associated therewith;
      a second grated SiGe layer located over; and
      a silicon capping layer over the second SiGe layer; and
      an emitter layer located over the silicon capping layer; and
   a non-bipolar transistor region, including transistors having gate electrodes and source/drains associated therewith.

2. The device recited in claim 1, wherein the Ge concentration of the first SiGe layer is about 12% by weight.

3. The device recited in claim 1, wherein the thickness ranges from about 26 nm to about 34 nm.

4. The device recited in claim 1, wherein the Ge concentration of the first SiGe ranges from about 5% to about 10% by weight.

5. The device recited in claim 1, wherein, the second SiGe layer has a graded concentration of Ge therein that ranges from about the Ge concentration of the first SiGe at the interface of the first and second SiGe layers to about zero Ge concentration at an upper surface of the second SiGe layer.

6. A semiconductor device, comprising:
   a bipolar transistor region, including:
      a first a silicon/germanium SiGe layer located over a collector tub and having a Ge concentration that ranges from about 5% to about 10% by weight and has a strain associated therewith;
      a second grated SiGe layer located over the first SiGe layer; and
      a silicon capping layer over the second SiGe layer; and
      an emitter layer located over the silicon capping layer; and
   a non-bipolar transistor region, including transistors having gate electrodes and source/drains associated therewith.

7. The device recited in claim 6, wherein a thickness of the first SiGe layer ranges from about 35 nm to about 43 nm.

8. The device recited in claim 6, wherein the Ge concentration of the first Si/Ge layer is about 7% by weight.

9. The device recited in claim 6, wherein the thickness of the first Si/Ge layer ranges from about 26 nm to about 34 nm.

10. The device recited in claim 6, wherein the second SiGe layer has a graded concentration of Ge therein that ranges from about the Ge concentration of the first SiGe at the interface of the first and second SiGe layers to about zero Ge concentration at an upper surface of the second SiGe layer.

* * * * *